(12) United States Patent
Lee

(10) Patent No.: US 8,902,578 B2
(45) Date of Patent: Dec. 2, 2014

(54) MICRO DAMPER DEVICE

(71) Applicant: Kun-Ta Lee, Taipei (TW)

(72) Inventor: Kun-Ta Lee, Taipei (TW)

( * ) Notice: Subject to any disclaimer, the term of this patent is extended or adjusted under 35 U.S.C. 154(b) by 198 days.

(21) Appl. No.: 13/762,494

(22) Filed: Feb. 8, 2013

(65) Prior Publication Data
US 2014/0092548 A1 Apr. 3, 2014

(30) Foreign Application Priority Data
Oct. 1, 2012 (TW) ................................ 01219002 U

(51) Int. Cl.
*G06F 1/16* (2006.01)
*H05K 7/00* (2006.01)
*G11B 33/08* (2006.01)

(52) U.S. Cl.
CPC . *H05K 7/00* (2013.01); *G11B 33/08* (2013.01)
USPC .................................................. 361/679.34

(58) Field of Classification Search
USPC .................................................. 361/679.34
See application file for complete search history.

(56) References Cited

U.S. PATENT DOCUMENTS

| | | | |
|---|---|---|---|
| 6,252,768 B1 * | 6/2001 | Lin | 361/679.34 |
| 6,975,476 B1 * | 12/2005 | Berding | 360/69 |
| 7,359,188 B2 * | 4/2008 | Hall et al. | 361/679.33 |
| 7,701,700 B2 * | 4/2010 | Hall et al. | 361/679.33 |
| 7,882,512 B2 * | 2/2011 | Hanai et al. | 720/600 |
| 8,116,075 B2 * | 2/2012 | Hall et al. | 361/679.33 |
| 2006/0023416 A1 * | 2/2006 | Chen | 361/685 |
| 2006/0034048 A1 * | 2/2006 | Xu | 361/685 |

* cited by examiner

*Primary Examiner* — Lisa Lea Edmonds
(74) *Attorney, Agent, or Firm* — McClure, Qualey & Rodack, LLP

(57) ABSTRACT

A micro damper device comprising a main body, a cover, a sensor component and a control component is provided. The main body has a first surface, a second surface, a convex and a coil. A current is introduced to the coil to form a magnetic field with a first and a second magnetic pole. The cover has a first end, a second end and a first magnetic component. The sensor component is disposed on a side opposite the convex to measure a first vibration direction of the second surface. The control component is electrically connected between the sensor component and the coil and controls the current for adjusting the polarity and the strength of the first magnetic pole for producing a force between the first magnetic pole and a third magnetic pole, which makes the main body move along a second vibration direction opposite the first vibration direction.

8 Claims, 5 Drawing Sheets

MICRO DAMPER DEVICE

This application claims the benefit from the priority to Taiwan Patent Application No. 101219002 filed on Oct. 1, 2012, the disclosures of which are incorporated by reference herein in their entirety.

CROSS-REFERENCES TO RELATED APPLICATIONS

Not applicable.

BACKGROUND OF THE INVENTION

1. Field of the Invention

The present invention provides a micro damper device, and more particularly, to a micro damper device which is disposed on a data storage device to offset vibrations generated during the operation of the data storage device.

2. Descriptions of the Related Art

With the rapid development of information multimedia, users have increasingly higher requirements on the capacity of data storage devices (especially conventional disk-type hard disks). Therefore, for a personal user, more hard disks must be continuously expanded or externally connected to satisfy the demand for a higher capacity. On the other hand, for an enterprise user, the capacity of both hard disks necessary for internal data files of the enterprise and a cloud database for use by external customers is incomparable to those needed by common personal users.

The conventional disk-type hard disk reads and writes data by means of changes between poles, so it has a relatively high precision. Moreover, the disk rotates at an extremely high speed during operation, so any unintentional application of an external force to the hard disk may cause the hard disk to read and write the data in a continuously swaying status. As a consequence, a read-write head and the hard disk may collide with each other to cause damage to the read-write head or magnetic sectors.

In view of this, the conventional practice of preventing hard disks from vibrating is usually to dispose the hard disks into a buffer device or a damping device and then fix the hard disks onto hard disk cabinets by means of screws. However, due to the use of the screws, much time is needed during installation. Meanwhile, hard disks disposed in this way may directly transmit generated vibrations to the hard disk cabinets at certain specific vibration frequencies, leading to the resonance effect between the hard disk cabinets, which will cause more serious damage.

Accordingly, it is important to provide a micro damper device which can effectively eliminate the vibrations or the resonance effect to prolong the service life of the hard disks to maintain integrity and security of the data.

SUMMARY OF THE INVENTION

An objective of the present invention is to provide a micro damper device capable of eliminating vibrations of a hard disk and the resonance effect to guarantee security of data storage and also prolong the service life of the hard disk.

To achieve the aforesaid objective, the present invention provides a micro damper device, which comprises a main body, a cover, a sensor component and a control component. The main body includes a first surface, a second surface, a convex and a coil. The coil is adapted to import a current to form a magnetic field with a first pole and a second pole. The cover comprises a first end, a second end and a first magnetic component. The sensor component is disposed on a side of the main body opposite to the convex for measuring a first vibration direction of the second surface. The control component is electrically connected between the sensor component and the coil. After the first vibration direction is measured by the sensor component, the control component controls the current flowing to the coil to adjust the polarity and the strength of the first pole so that a force is generated between the first pole and the third pole to make the main body move along a second vibration direction opposite the first vibration direction.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
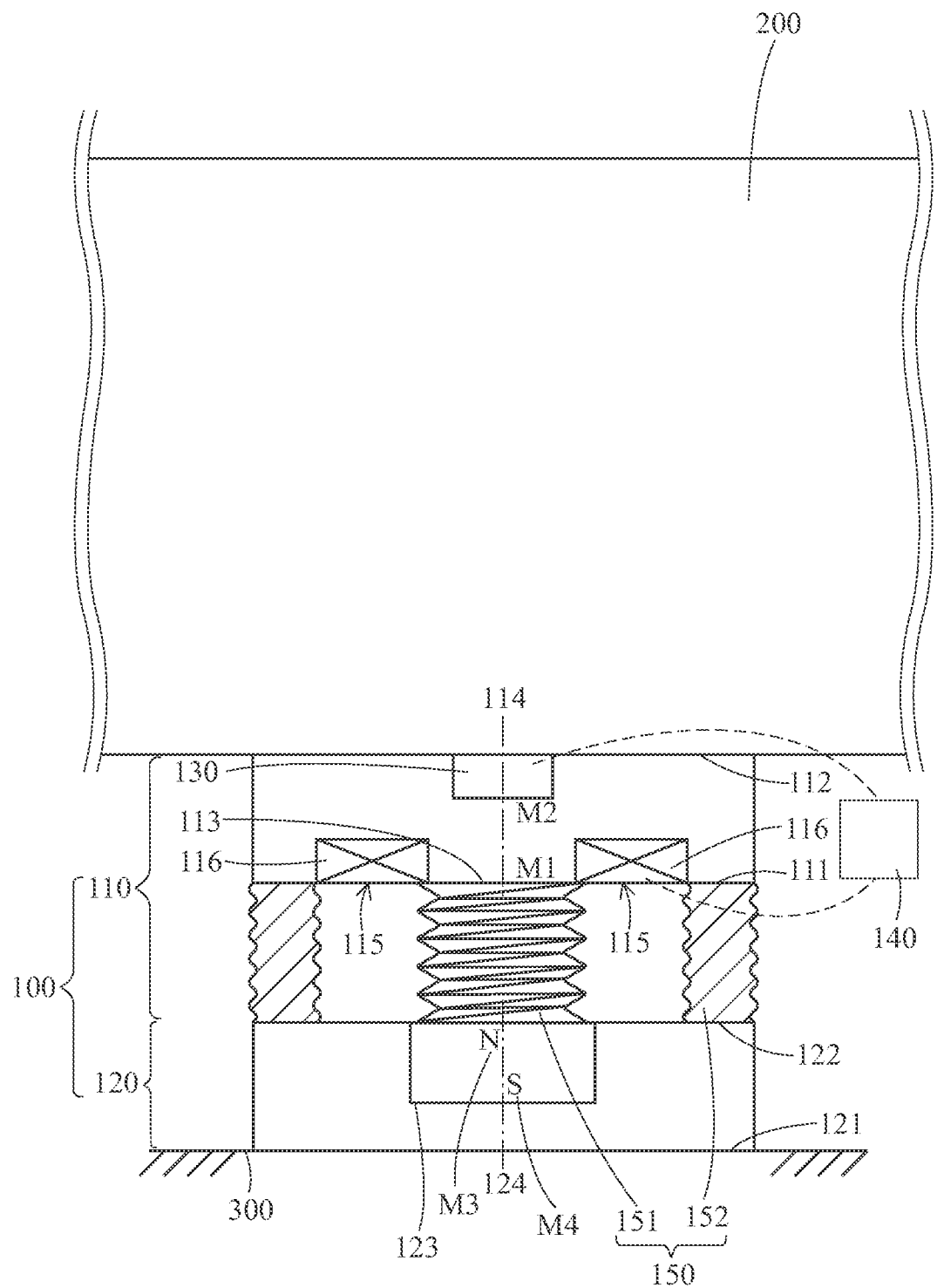
FIG. 1 is a schematic cross-sectional view illustrating a micro damper device of the present invention.

FIG. 1 is a schematic view illustrating a micro damper device 100 according to an embodiment of the present invention. It shall be particularly appreciated herein that for convenience of understanding, some components are not depicted according to their original dimensions. As shown, the micro damper device 100 for use in a data storage device 200 according to the present invention mainly comprises a main body 110, a cover 120, a sensor component 130 and a control component 140. Spatial relationships among and technical contents of the components will be sequentially described as follows.

Figure 2:
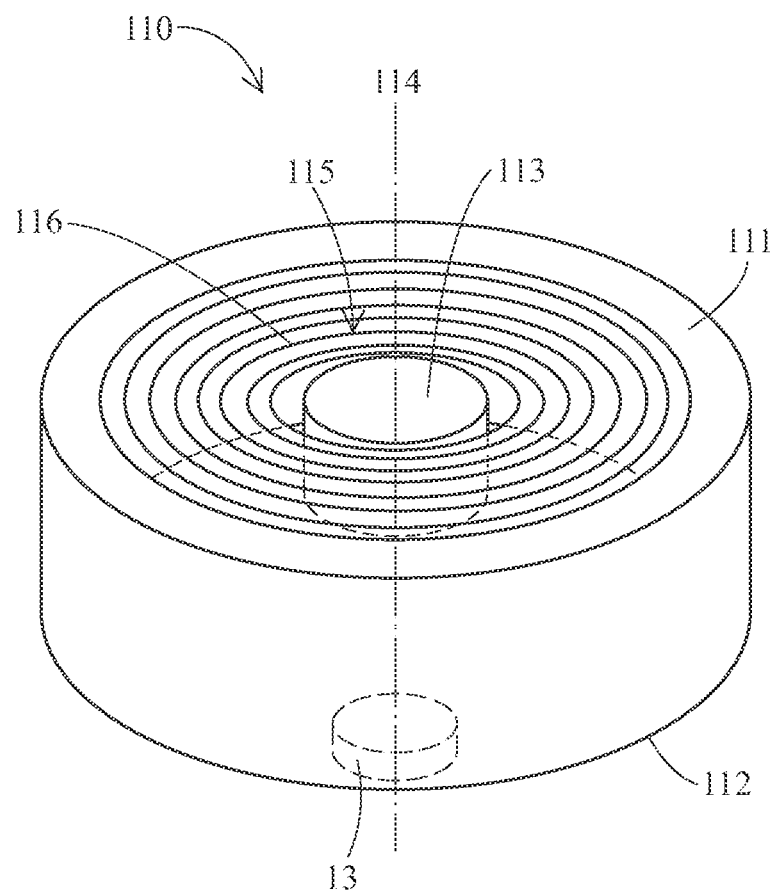
FIG. 2 is a perspective view illustrating a main body of the micro damper device of the present invention which has been rotated by 180°.

FIG. 2 shows a perspective view illustrating the main body 110 of the micro damper device 100 which has been rotated by 180°. As shown, the main body 110 is attached to the data storage device 200, and has a first surface 111, a second surface 112, a convex 113, a central portion 114, a recessed portion 115 and a coil 116. The first surface 111 is disposed to face the cover 120, while the second surface 112 is disposed opposite the first surface 111 and is configured to come into contact with the data storage device 200. The convex 113 is formed on the central portion 114 of the main body 110, and defines the recessed portion 115 with the first surface 111. The coil 116 is wound around the convex 113, and is accommodated in the recessed portion 115. Thus, through the control of the control component 140, the coil 116 introduces a current to form a magnetic field, which has a first pole M1 and a second pole M2 opposite the first pole M1. In this case, in this embodiment, the main body 110 is preferably a magnetic housing to assist in strengthening the magnetic field.

Still, with reference to FIG. 1, the cover 120 has a first end 121, a second end 122 and a first magnetic component 123.

The second end 122 is disposed opposite the first end 121, and faces the first surface 111 of the main body 110. The first magnetic component 123 is disposed in a central portion 124 of the cover 120 to generate a third pole M3 and a fourth pole M4 opposite the third pole M3. The third pole M3 faces the first pole M1 of the magnetic field formed by the coil 116. As shown, in this embodiment, the third pole M3 is an N pole and faces the main body 110, while the fourth pole M4 is an S pole and faces the first end 121.

The sensor component 130 is disposed on a side of the body 110 opposite to the convex 113. In more detail, the sensor component 130 is disposed at a center of the second surface 112 to come into contact with the data storage device 200. The sensor component 130 is electrically connected to the control component 140 to measure a first vibration direction S1 of the second surface 112 and transform the first vibration direction S1 into a corresponding first resonance waveform. In this embodiment, the sensor component 130 may be an accelerometer or some other component capable of measuring a vibration, and is adapted to measure the direction and the magnitude of the first vibration direction S1 in real time.

As described above, the control component 140 is electrically connected between the sensor component 130 and the coil 116, and controls the magnitude and the direction (a clockwise direction or a counterclockwise direction) of the current according to the first vibration direction S1 measured by the sensor component 130 and the first resonance waveform to adjust the polarities and the strengths of the first pole M1 and the second pole M2 respectively. Thereby, a force is generated between the first pole M1 and the third pole M3 to make the main body 110 move along a second vibration direction S2 opposite the first vibration direction S1. At this point, in response to the second vibration direction S2, the sensor component 130 can also transform the second vibration direction S2 into a corresponding second resonance waveform.

Figure 3:
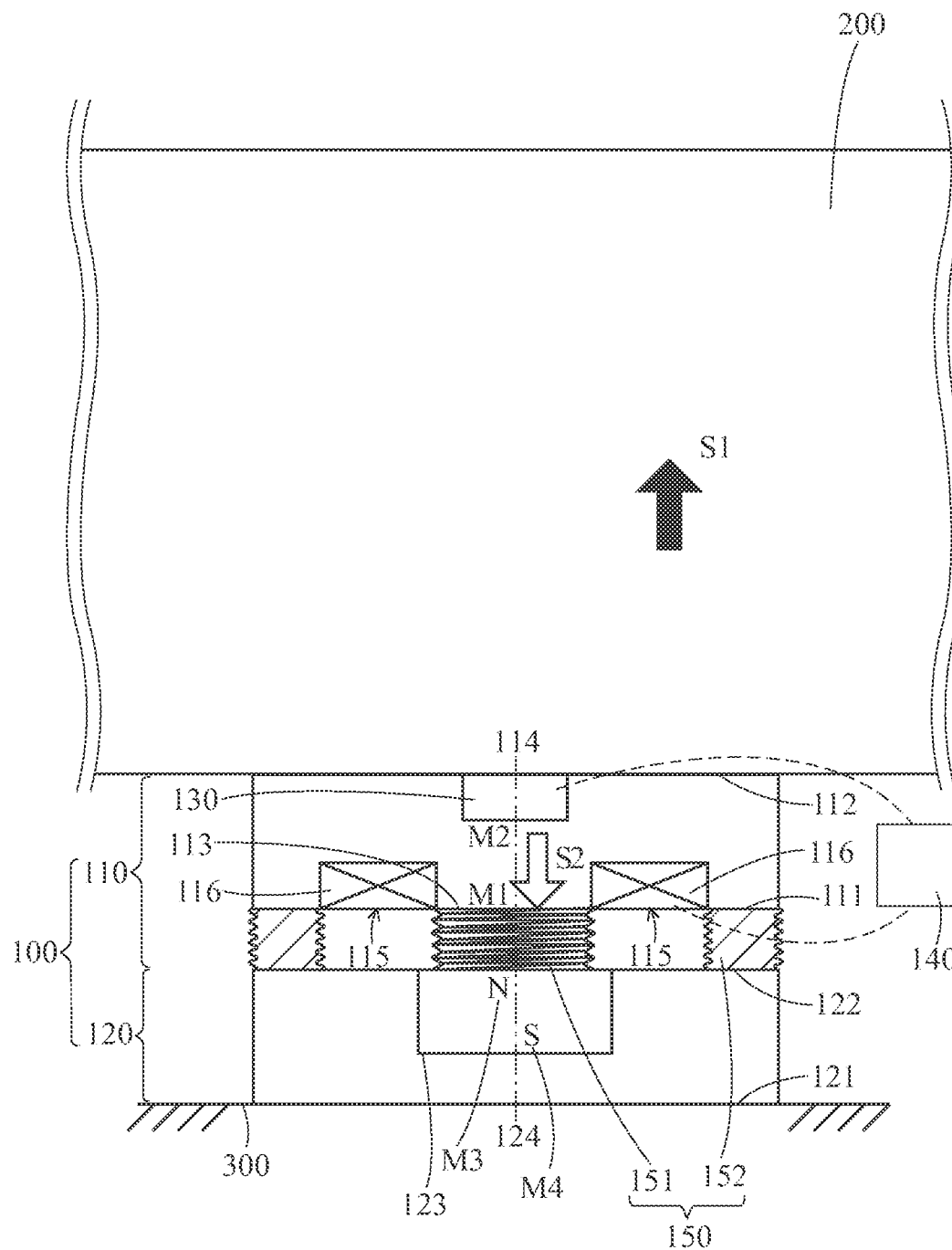
FIG. 3 is a schematic view illustrating the micro damper device of the present invention when being subjected to an upward pulling force during vibration.

Thus, as shown in FIG. 3, when the first vibration direction S1 is away from the second surface 112 and corresponds to the first resonance waveform during operation of the data storage device 200, the polarity of the first pole M1 is controlled by the control component 140 to be different from the polarity of the third pole M3, which makes an attractive force according to the principle that poles with different polarities attract each other. Meanwhile, the second resonance waveform is complementary to the first resonance waveform to inhibit the data storage device 200 from moving away from the second surface 112.

Figure 4:
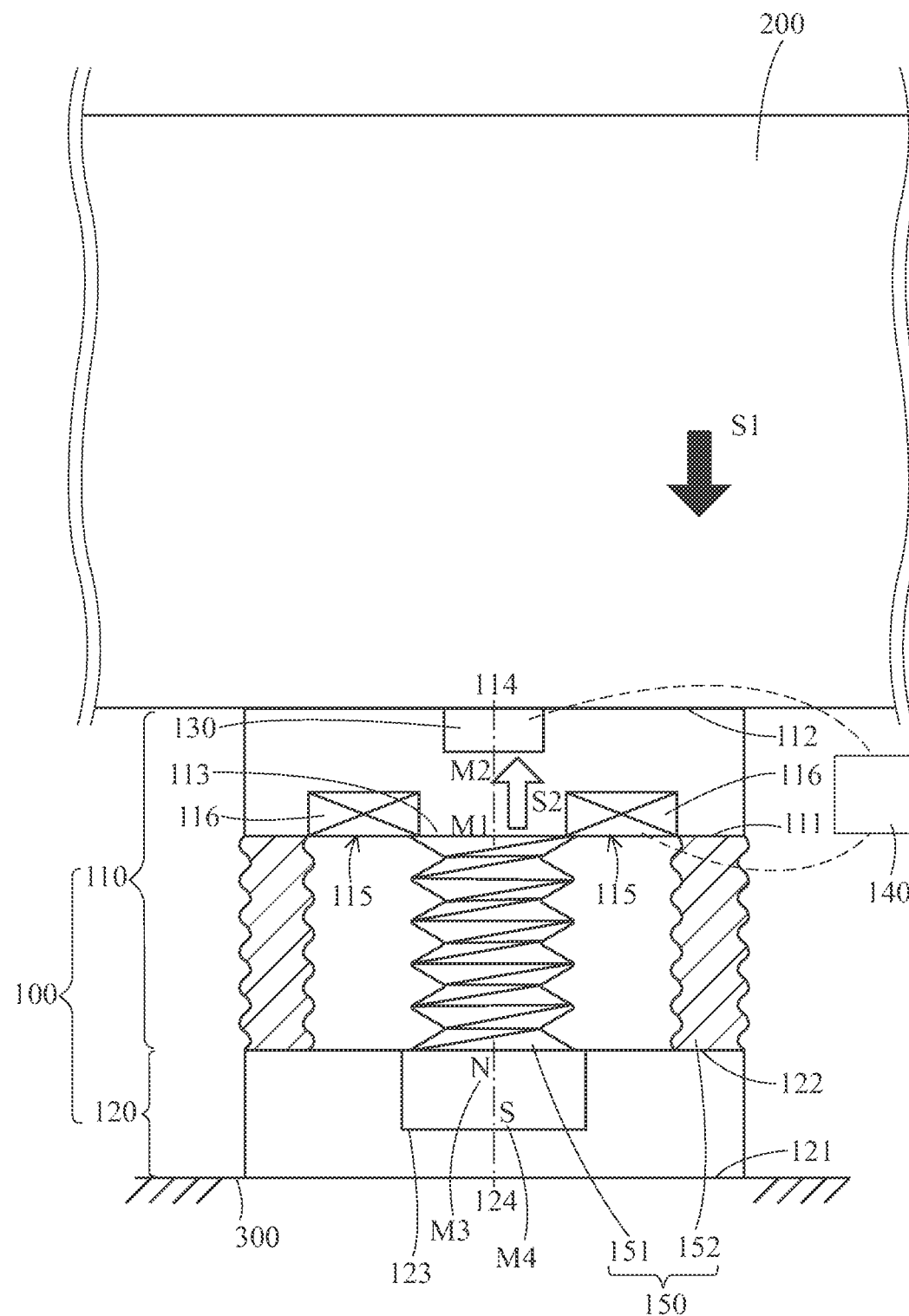
FIG. 4 is a schematic view illustrating the micro damper device of the present invention when being subjected to a downward pressing force during vibration.

Similarly, as shown in FIG. 4, when the first vibration direction S1 is directed to the second surface 112 and corresponds to the first resonance waveform during the operation of the data storage device 200, the polarity of the first pole M1 is controlled by the control component 140 to be the same as that of the polarity of the third pole M3, which makes a repulsive force according to the principle that the poles with the same polarity repel each other. Meanwhile, the second resonance waveform is complementary to the first resonance waveform to inhibit the data storage device 200 from moving close to the second surface 112.

In other words, the first vibration direction S1 is appropriately transformed to correspond to the first resonance waveform, while the second vibration direction S2 is also transformed to correspond to the second resonance waveform complementary to the first resonance waveform.

With reference again to FIG. 1, the micro damper device 100 further comprises a buffer device 150, which is disposed between the main body 110 and the cover 120 and has a first buffer 151 and a second buffer 152. As shown, the first buffer 151 is preferably disposed between the convex 113 of the main body 110 and the second end 122 of the cover 120. The second buffer 152 is preferably disposed around the perimeter of the first surface 111 to be correspondingly disposed on the perimeter of the second end 122 of the cover 120. Moreover, in this embodiment, the first buffer 151 is preferably a spring, while the second buffer 152 is preferably a diaphragm.

Hereinbelow, the operation mechanism of the micro damper device 100 of the present invention will be introduced in detail.

First, as shown in FIG. 3, when the data storage device 200 (e.g., the aforesaid hard disk) generates a vibration during operation and the first vibration direction S1 of the vibration is away from the second surface 112, the control component 140 controls a counterclockwise current to be introduced to the coil 116 so that the coil 116 produces a magnetic field with a first pole M1 which is an S pole and a second pole M2 which is an N pole.

In this case, the first pole M1 (i.e., the S pole) of the magnetic field is different from the third pole M3 (i.e., the N pole) of the first magnetic component 123. Therefore, the main body 110 generates an attractive force according to the principle that poles with different polarities attract each other, and the movement of the data storage device 200 in the first vibration direction S1 is eliminated by means of the first resonance waveform and the second resonance waveform complementary to each other so that the data storage device 200 is restored into an equilibrium status. Moreover, in response to the attractive force, the first buffer 151 and the second buffer 152 will be deformed due to compression.

Similarly, as shown in FIG. 4, when the data storage device 200 (e.g., the aforesaid hard disk) generates a vibration during operation and the first vibration direction S1 of the vibration is directed to the second surface 112, the control component 140 controls a clockwise current that is introduced to the coil 116 so that the coil 116 produces a magnetic field with a first pole M1 which is an N pole and a second pole M2 which is an S pole.

In this case, the first pole M1 (i.e., the N pole) of the magnetic field is the same as the third pole M3 (i.e., the N pole) of the first magnetic component 123. Therefore, the main body 110 generates a repulsive force according to the principle that the poles with the same polarity repel each other, and the movement of the data storage device 200 in the first vibration direction S1 is eliminated by means of the first resonance waveform and the second resonance waveform complementary to each other so that the data storage device 200 is restored into an equilibrium status. Moreover, in response to the repulsive force, the first buffer 151 and the second buffer 152 will be deformed due to stretching. This can prevent large repulsive force between the main body 110 and the cover 120, which may cause the main body 110 and the cover 120 to disengage from each other.

Figure 5:
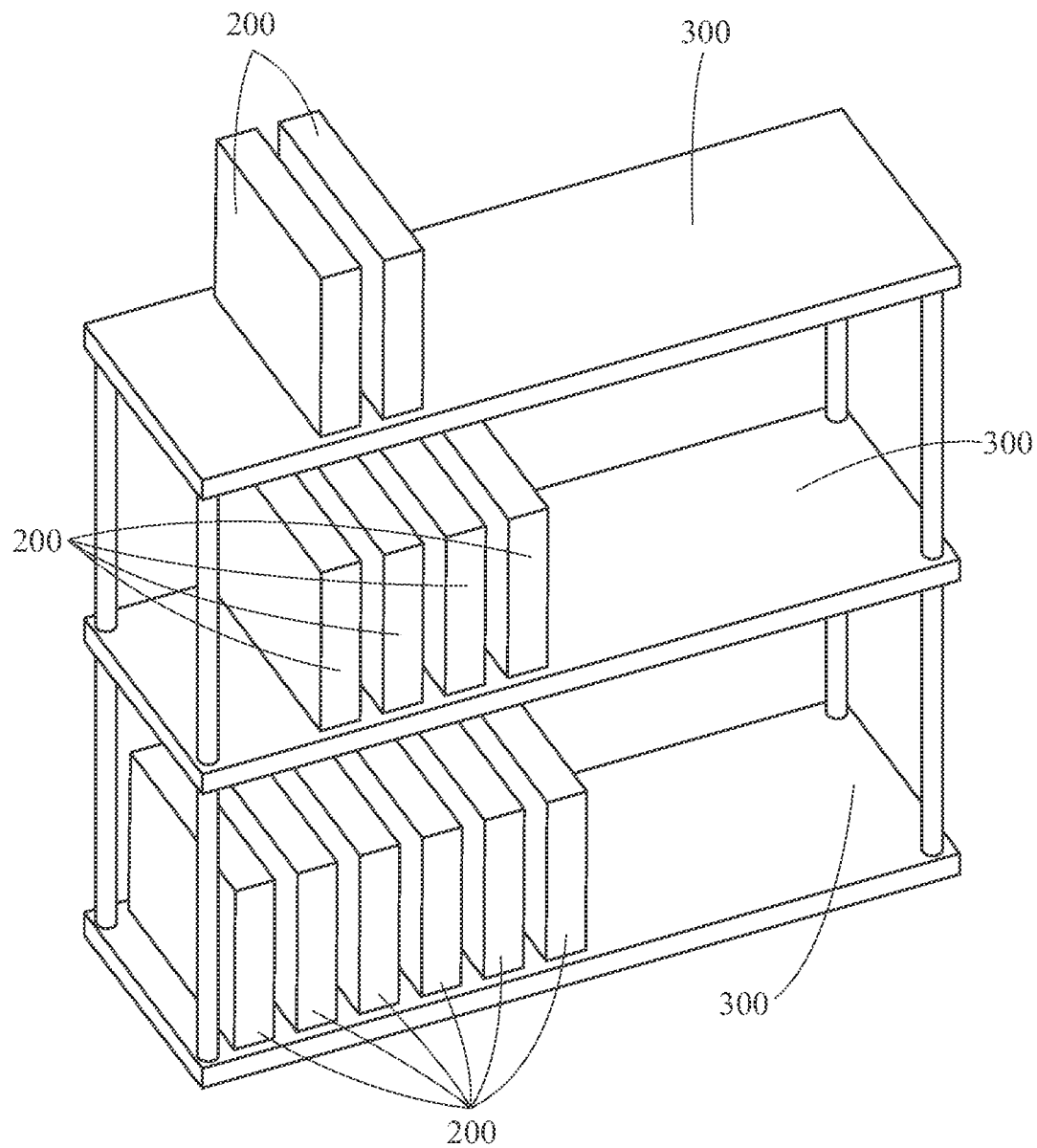
FIG. 5 is a schematic view illustrating a installation of the micro damper device of the present invention.

FIG. 5 shows a schematic view illustrating the installation of the micro damper device 100. As shown, when the user places a plurality of data storage devices 200 on a fixed mount of a hard disk cabinet in layers, one or a plurality of micro damper devices 100 (not shown) can be installed between the data storage devices 200 or between the data storage devices 200 and a supporting surface 300 of the fixed mount of the hard disk cabinet respectively to eliminate external vibrations generated by the data storage devices 200. This can not only prevent the internal components of the data storage devices 200 from being damaged due to long-term vibrations, but can also further prolong the service life of the data storage devices 200.

According to the above descriptions, through the magnetic relationships between the first pole M1 generated by the coil 116 after being energized and the third pole M3 of the first magnetic component 123, the main body 110 of the micro damper device 100 of the present invention can be driven to move back and forth with respect to the vibration direction S1 (as shown in FIG. 3 and FIG. 4) to achieve the damping effect of the micro damper device 100 of the present invention. In addition, the micro damper device 100 is not limited to only being installed in the up/down vibration direction. When being disposed in the up/down direction, the left/right direction or the front/back direction of the data storage device 200, the micro damper device 100 can also assist in sensing and generating a force opposite the external vibration in direction. Moreover, the number of micro damper devices 10 may be adjusted depending on the different damping requirements of the user.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A micro damper device for use in a data storage device, comprising:
    a main body, including:
        a first surface and a second surface opposite the first surface;
        a convex formed on a central portion of the main body, and defining a recessed portion with the first surface; and
        a coil wound around the convex, being disposed in the recessed portion, wherein the coil is adapted to introduce a current to form a magnetic field, and the magnetic field has a first pole and a second pole opposite the first pole;
    a cover, comprising:
        a first end, and a second end opposite the first end, wherein the second end faces the first surface of the main body; and
        a first magnetic component, being disposed in a central portion of the cover for generating a third pole and a fourth pole opposite the third pole, wherein the third pole faces the first pole;
    a sensor component, being disposed on a side of the main body opposite to the convex for measuring a first vibration direction of the second surface; and
    a control component electrically connected between the sensor component and the coil, being adapted to control the current according to the first vibration direction measured by the sensor component for adjusting the polarity and the strength of the first pole so that a force is generated between the first pole and the third pole to make the main body move along a second vibration direction opposite the first vibration direction;
    wherein the main body is disposed on the data storage device, the second surface of the main body is adapted to contact the data storage device, the cover is disposed on a supporting surface for driving the first end of the cover to contact the supporting surface; when the first vibration direction is away from the second surface, the polarity of the first pole is different from the polarity of the third pole, which makes the force be an attractive force; and when the first vibration direction is directed to the second surface, the polarity of the first pole is the same as the polarity of the third pole, which makes the force be a repulsive force.

2. The micro damper device as claimed in claim 1, wherein the first vibration direction corresponds to a first resonance waveform, and the second vibration direction corresponds to a second resonance waveform complementary to the first resonance waveform.

3. The micro damper device as claimed in claim 2, wherein the main body is a magnetic housing for strengthening the magnetic field.

4. The micro damper device as claimed in claim 3, wherein the sensor component is an accelerometer.

5. The micro damper device as claimed in claim 1, further comprising a buffer device disposed between the main body and the cover.

6. The micro damper device as claimed in claim 5, wherein the buffer device has a first buffer and a second buffer, the first buffer is disposed between the convex of the main body and the first magnetic component of the cover, and the second buffer is disposed between the first surface of the main body and the second end of the cover.

7. The micro damper device as claimed in claim 6, wherein the first buffer is a spring.

8. The micro damper device as claimed in claim 7, wherein the second buffer is a diaphragm.

* * * * *